United States Patent [19]
Sperling et al.

[11] Patent Number: 5,815,246
[45] Date of Patent: Sep. 29, 1998

[54] TWO-DIMENSIONALLY BALANCED POSITIONING DEVICE, AND LITHOGRAPHIC DEVICE PROVIDED WITH SUCH A POSITIONING DEVICE

[75] Inventors: Frank B. Sperling; Henricus W. A. Janssen, both of Eindhoven, Netherlands

[73] Assignee: U.S. Philips Corporation, New York, N.Y.

[21] Appl. No.: 878,362

[22] Filed: Jun. 18, 1997

[30] Foreign Application Priority Data

Dec. 24, 1996 [EP] European Pat. Off. ............ 962037099

[51] Int. Cl.⁶ ............................ G03B 27/42; G03B 27/53
[52] U.S. Cl. ................................. 355/53; 355/72; 269/73
[58] Field of Search .......................... 355/53, 72; 269/73; 414/676, 749; 250/491.1, 492.2

[56] References Cited

U.S. PATENT DOCUMENTS

| | | | |
|---|---|---|---|
| 5,150,153 | 9/1992 | Franken et al. | 355/53 |
| 5,208,497 | 5/1993 | Ishii et al. | 310/12 |
| 5,446,519 | 8/1995 | Makinouchi | 355/53 |
| 5,623,853 | 4/1997 | Novak et al. | 74/490.09 |

FOREIGN PATENT DOCUMENTS

| | | |
|---|---|---|
| 0421527 | 4/1991 | European Pat. Off. . |
| 421527A1 | 4/1991 | European Pat. Off. . |
| 498496A1 | 8/1992 | European Pat. Off. . |
| 0498496 | 8/1996 | European Pat. Off. . |

*Primary Examiner*—A. A. Mathews

[57] ABSTRACT

A positioning device with a base and a displaceable unit which is displaceable relative to the base parallel to an X-direction and parallel to a Y-direction by means of an X-actuator and a Y-actuator. The X-actuator and the Y-actuator each have a first part which is coupled to the displaceable unit, seen parallel to the X-direction and Y-direction, respectively, and a second part which is coupled to a common balancing unit, seen parallel to the X-direction and the Y-direction, respectively, which balancing unit is displaceably guided parallel to the X-direction and to the Y-direction along a guide which extends parallel to the X-direction and the Y-direction and which is fastened to the base. During operation the first parts of the X-actuator and the Y-actuator exert on the second parts reaction forces which are directed parallel to the X-direction and to the Y-direction, respectively, whereby the common balancing unit is displaced parallel to the X-direction and the Y-direction, respectively. It is prevented thereby that the reaction forces are transmitted into the base, so that mechanical vibrations of the base are reduced. In a special embodiment, the balancing unit comprises a support body which comprises a surface which extends parallel to the X-direction and the Y-direction and along which the displaceable unit is guided. The positioning device can be used for the displacement and positioning of a substrate holder in a lithographic device for the manufacture of semiconductor substrates.

13 Claims, 7 Drawing Sheets

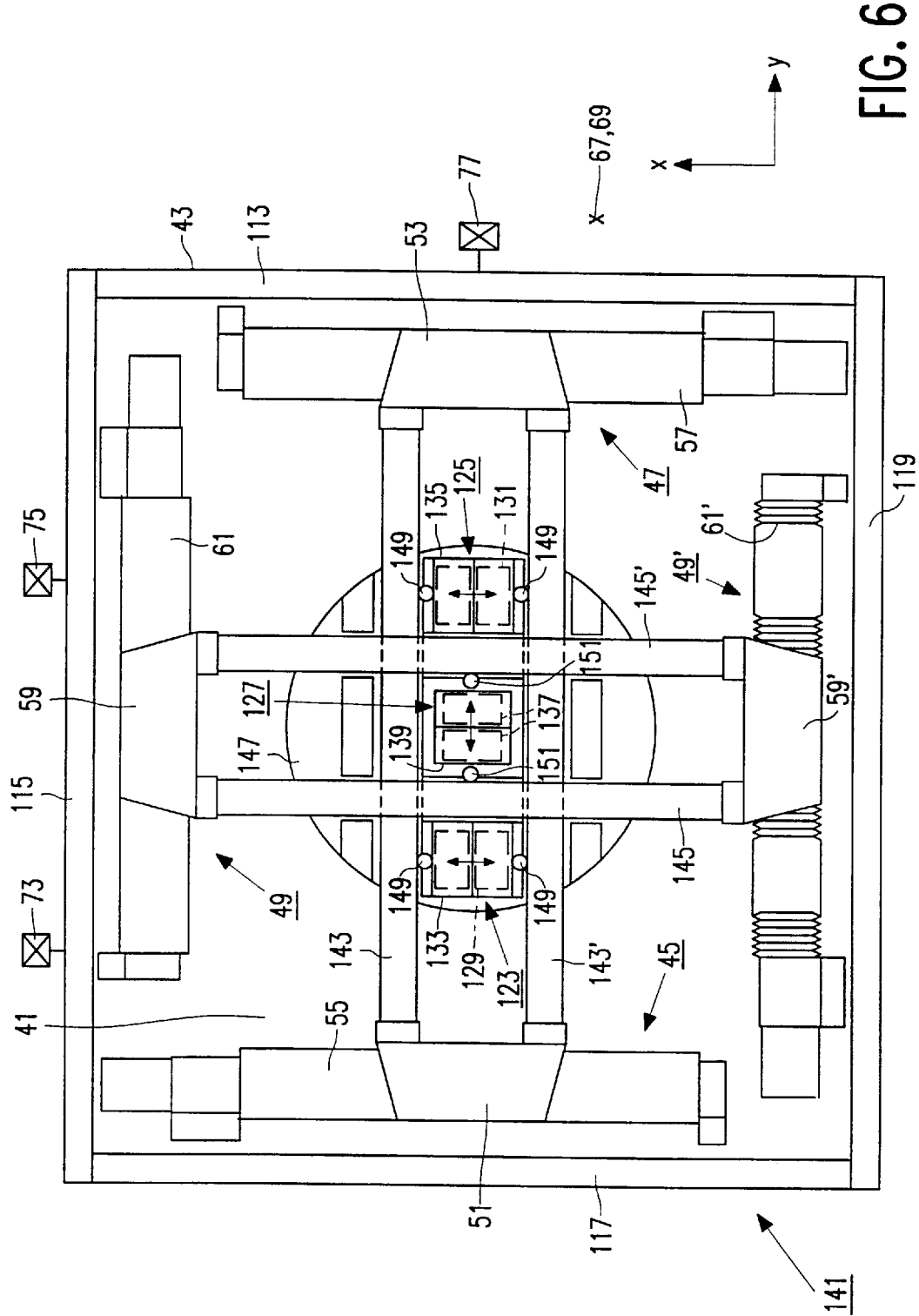

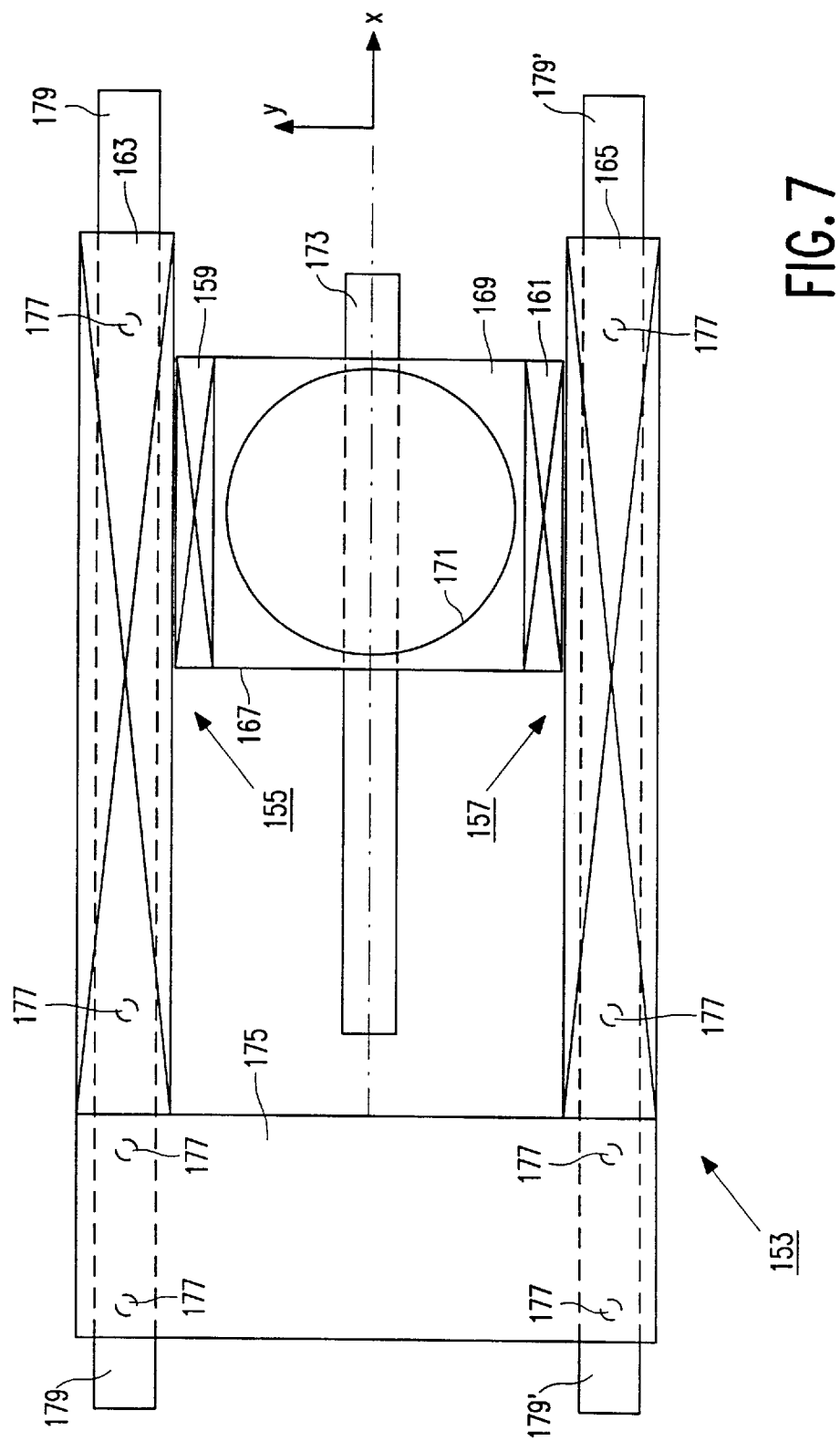

TWO-DIMENSIONALLY BALANCED POSITIONING DEVICE, AND LITHOGRAPHIC DEVICE PROVIDED WITH SUCH A POSITIONING DEVICE

BACKGROUND OF THE INVENTION

The invention relates to a positioning device provided with a base and a displaceable unit which is displaceable relative to the base by means of an X-actuator along a first guide which extends parallel to an X-direction, which X-actuator comprises a first part and a second part which are displaceable relative to one another and which exert a driving force on one another during operation, the first part of the X-actuator being coupled to the displaceable unit, seen parallel to the X-direction, and the second part of the X-actuator being coupled to a balancing unit, seen parallel to the X-direction, which balancing unit is displaceable relative to the base along a second guide which is fastened to the base and which extends parallel to the X-direction.

The invention also relates to a lithographic device provided with a frame to which a radiation source, a mask holder, a focusing unit, and a positioning device are fastened, said focusing unit having a main axis, while the positioning device comprises a substrate holder which is displaceable relative to the focusing unit parallel to an X-direction which is perpendicular to the main axis and parallel to a Y-direction which is perpendicular to the X-direction and to the main axis.

A positioning device of the kind mentioned in the opening paragraph is known from U.S. Pat. No. 5,208,497. The known positioning device is suitable for use in a photocopying machine, where the displaceable unit of the positioning device comprises an optical unit which is displaceable parallel to a single scanning direction relative to a frame of the photocopying machine. During operation, the displaceable unit of the positioning device is displaced under the influence of a driving force exerted by the second part of the X-actuator on the first part of the X-actuator. The first part of the X-actuator here exerts on the second part of the X-actuator a reaction force with a value which is equal to a value of the driving force and with a direction opposed to a direction of the driving force. Since the second part of the X-actuator is coupled to the balancing unit, and the balancing unit is displaceable along the second guide, the balancing unit is displaced along the second guide under the influence of the reaction force in a direction opposed to the direction in which the displaceable unit is displaced under the influence of the driving force. It is prevented thereby that the reaction force is transmitted to the frame of the photocopying machine, so that vibrations of the photocopying machine arising from the reaction force are prevented. Since the displacement of the balancing unit is a function of the value of the reaction force and the mass of the balancing unit, a so-called inertial reaction force compensation is used in the known positioning device. An advantage of such an inertial reaction force compensation is that the effect of the reaction force compensation is substantially independent of the value of the mass of the displaceable unit. Besides this inertial reaction force compensation, a kinematic reaction force compensation is known from other generally known and usual positioning devices, where the displacement of a balancing mass is kinematically coupled to the displacement of a displaceable unit. Such a kinematic reaction force compensation, however, only functions satisfactorily if the mass of the displaceable unit has a substantially constant, predetermined value.

A disadvantage of the known positioning device is that the displaceable unit is displaceable parallel to only a single direction. U.S. Pat. No. 5,208,497 does not describe in what manner an inertial reaction force compensation is provided for a positioning device with a displaceable unit which is displaceable parallel to two different directions. An obvious constructional stack of two linear positioning devices known from U.S. Pat. No. 5,208,497, in which a first of the two linear positioning devices is displaceable in its entirety by means of the second linear positioning device parallel to a direction different from a displacement direction of the first linear positioning device, leads to an impractical construction and to positioning inaccuracies which are caused by so-called stacking errors. In addition, residual vibrations arise in the base in such a constructional stack because the driving forces of the linear positioning devices are not directed perfectly parallel to the displacement directions of the linear positioning devices.

SUMMARY OF THE INVENTION

It is an object of the invention to provide a positioning device of the kind mentioned in the opening paragraph whose displaceable unit is displaceable parallel to two different directions, while an inertial reaction force compensation is provided by means of a practical construction and said residual vibrations are prevented as much as possible.

The invention is for this purpose characterized in that the displaceable unit is displaceable relative to the base along the first guide parallel to a Y-direction by means of a Y-actuator, the first guide comprising a first surface which extends parallel to the X-direction and the Y-direction, which Y-actuator comprises a first part and a second part which are displaceable relative to one another and which exert a driving force on one another during operation, while the first part of the Y-actuator is coupled to the displaceable unit, seen parallel to the Y-direction, and the second part of the Y-actuator is coupled to said balancing unit, seen parallel to the Y-direction, the second guide comprising a second surface which extends parallel to the X-direction and to the Y-direction.

According to the invention, the balancing unit thus is a common balancing unit for the X-actuator and the Y-actuator. Since the second guide comprises a second surface which extends parallel to the X-direction and the Y-direction, the balancing unit is displaceable under the influence of the reaction forces of the X-actuator and the Y-actuator parallel to any direction which lies in the plane defined by the X-direction and the Y-direction. In addition, the balancing unit is rotatable about an axis of rotation which is perpendicular to the X-direction and to the Y-direction. An inertial reaction force compensation is provided in this manner not only for reaction forces directed parallel to the X-direction or parallel to the Y-direction, but also for all reaction forces which are directed parallel to the plane defined by the X-direction and the Y-direction. An inertial reaction moment compensation is also provided for reaction moments exerted by the reaction forces of the X-actuator and the Y-actuator on the balancing unit about said axis of rotation of the balancing unit. Since the balancing unit is a common balancing unit, and the first guide and the second guide both comprise a flat surface, a simple construction of the positioning device is obtained.

A special embodiment of a positioning device according to the invention is characterized in that the balancing unit comprises a support body which comprises the first surface. The support body is, for example, a granite slab over which the displaceable unit is displaceably guided. The support body in this embodiment has a dual function, i.e. serving as a support and guide for the displaceable unit and serving as a balancing unit for the X-actuator and the Y-actuator.

A further embodiment of a positioning device according to the invention is characterized in that a center of gravity of the displaceable unit and a center of gravity of the balancing unit have identical positions, seen in a direction perpendicular to the X-direction and the Y-direction. Undesirable reaction moments about every axis through the center of gravity of the balancing unit and parallel to a plane defined by the X-direction and the Y-direction are prevented in this further embodiment if a point of application of the driving forces on the displaceable unit and a point of application of the reaction forces on the balancing unit have positions corresponding to said positions of the centers of gravity of the displaceable unit and the balancing unit, as seen in a direction perpendicular to the X-direction and the Y-direction.

A yet further embodiment of a positioning device according to the invention, in which the balancing unit comprises a support body which comprises the first surface, is characterized in that the support body comprises at least one raised wall which bounds the first surface. The use of the raised wall achieves in a simple and effective manner that the center of gravity of the displaceable unit and the center of gravity of the balancing unit have identical positions when seen in a direction perpendicular to the X-direction and the Y-direction.

A special embodiment of a positioning device according to the invention is characterized in that the balancing unit is guided along the second guide by means of a static gas bearing. The use of the static gas bearing provides a substantially frictionless guiding of the balancing unit along the second guide, so that the displacement of the balancing unit under the influence of the reaction forces is not disturbed with by frictional forces occurring between the balancing unit and the second guide. Such a disturbance of the displacement of the balancing unit would lead to an undesirable disturbance of the reaction force compensation.

A further embodiment of a positioning device according to the invention is characterized in that the balancing unit comprises a first balancing part and a second balancing part, said first balancing part being coupled to the second part of the X-actuator and the second part of the Y-actuator, and said second balancing part being rotatable relative to the first balancing part about an axis of rotation which extends perpendicularly to the X-direction and the Y-direction by means of a rotation motor, which rotation motor comprises a first part and a second part which are rotatable relative to one another and which exert a driving torque on one another during operation, the first part of the rotation motor being fastened to the first balancing part and the second part of the rotation motor being fastened to the second balancing part. When the displaceable unit is displaced from a starting position over a path along the first guide and returns to its starting position at the end of the path, the balancing unit will be in an end position, seen parallel to the X-direction and parallel to the Y-direction, at the end of the path which corresponds substantially to a starting position in which the balancing unit is present at the start of the path. Small deviations between said starting position and end position of the balancing unit are to be corrected by means of so-called anti-drift actuators which are fastened to the base and which exert comparatively small anti-drift forces on the balancing unit. The use of such anti-drift actuators is known from U.S. Pat. No. 5,208,497. The reaction forces on the balancing unit, however, not only generate displacements of the center of gravity of the balancing unit parallel to the X-direction and parallel to the Y-direction, but also rotations of the balancing unit about an axis of rotation which extends perpendicularly to the X-direction and the Y-direction. Such rotations of the balancing unit cannot be compensated for by the comparatively small anti-drift forces of the anti-drift actuators. The use of the first balancing part, the second balancing part, and said rotation motor, however, renders the first balancing part rotatable under the influence of the driving moment of the rotation motor to such an extent that the rotations of the first balancing part caused by the reaction forces are compensated for. Since the reaction moment of the rotation motor is exerted on the second balancing part which is brought into rotation by the reaction moment, the reaction moment of the rotation motor is not transmitted to the base. The second balancing part is constructed, for example, as a flywheel.

A still further embodiment of a positioning device according to the invention is characterized in that the second part of the X-actuator is fastened to the balancing unit, the second part of the Y-actuator is fastened to the first part of the X-actuator, and the first part of the Y-actuator is coupled to the displaceable unit, as seen parallel to the X-direction and parallel to the Y-direction. In this further embodiment, the Y-actuator is displaceable in its entirety parallel to the X-direction by means of the X-actuator. The balancing unit common to the X-actuator and the Y-actuator is fastened to the second part of the X-actuator, while reaction forces of the Y-actuator are transmitted to the common balancing unit via the X-actuator.

A particular embodiment of a positioning device according to the invention is characterized in that the positioning device is provided with a further X-actuator and a further Y-actuator, a first part of the further X-actuator and a first part of the further Y-actuator being fastened to the displaceable unit, while a second part of the further X-actuator and a second part of the further Y-actuator are fastened to the first part of the Y-actuator. In this particular embodiment, the displaceable unit is displaceable over comparatively great distances with comparatively low accuracies by means of the X-actuator and the Y-actuator and is displaceable over comparatively small distances with comparatively high accuracies by means of the further X-actuator and the further Y-actuator. Reaction forces of the further X-actuator and the further Y-actuator are transmitted to the common balancing unit via the Y-actuator and the X-actuator.

A further embodiment of a positioning device according to the invention is characterized in that the second part of the X-actuator and the second part of the Y-actuator are fastened to the balancing unit. In this further embodiment, the second part of the X-actuator and the second part of the Y-actuator are fastened directly to the balancing unit, so that reaction forces of the X-actuator and reaction forces of the Y-actuator are directly transmitted into the balancing unit. The displaceable unit is coupled to the first part of the X-actuator, as seen parallel to the X-direction, and coupled to the first part of the Y-actuator, as seen parallel to the Y-direction.

A yet further embodiment of a positioning device according to the invention is characterized in that the positioning device is provided with a further X-actuator and a further Y-actuator, a first part of the further X-actuator and a first part of the further Y-actuator being fastened to the displaceable unit, and a second part of the further X-actuator and a second part of the further Y-actuator being coupled to the first part of the X-actuator, seen parallel to the X-direction, and coupled to the first part of the Y-actuator, seen parallel to the Y-direction. In this yet further embodiment, the displaceable unit is displaceable over comparatively great distances with comparatively low accuracies by means of the X-actuator and the Y-actuator and is displaceable over comparatively small distances with comparatively high accuracies by means of the further X-actuator and the further Y-actuator. Reaction forces of the further X-actuator are transmitted to the common balancing unit via the X-actuator, while reaction forces of the further Y-actuator are transmitted to the common balancing unit via the Y-actuator.

A lithographic device of the kind mentioned in the opening paragraph is known from EP-A-0 498 496. The known lithographic device is used in the manufacture of integrated semiconductor circuits by means of an optical lithographic process. The radiation source of the known lithographic device is a light source, and the focusing unit is an optical lens system by means of which a sub-pattern of an integrated semiconductor circuit is imaged on a reduced scale on a semiconductor substrate which can be placed on the substrate holder of the positioning device, said sub-pattern being present on a mask which can be placed on the mask holder of the lithographic device. Such a semiconductor substrate comprises a large number of fields on which identical semiconductor circuits are provided. The individual fields of the semiconductor substrate are for this purpose exposed consecutively, the semiconductor substrate being in a constant position relative to the mask and the focusing unit during the exposure of an individual field, while between two consecutive exposure steps a next field of the semiconductor substrate is brought into position relative to the focusing unit by means of the positioning device. This process is repeated a number of times, with a different sub-mask providing a different pattern each time, so that integrated semiconductor circuits of a comparatively complicated structure can be manufactured. The structure of such integrated semiconductor circuits has detail dimensions which lie in the submicron range. The sub-patterns present on the consecutive masks should accordingly be imaged on said fields of the semiconductor substrate with an accuracy relative to one another which lies in the submicron range. The semiconductor substrate should accordingly be positioned relative to the mask and the focusing unit by means of the positioning device with an accuracy which also lies in the submicron range. To reduce the time required for manufacturing the semiconductor circuits, the semiconductor substrate should in addition be displaced at a comparatively high speed between two consecutive exposure steps and be positioned relative to the mask and the focusing unit with the desired accuracy.

According to the invention, the lithographic device is characterized in that the positioning device is a positioning device according to the invention, while the displaceable unit of the positioning device comprises the substrate holder, and the base of the positioning device is fastened to the frame. The use of the positioning device according to the invention achieves that comparatively great reaction forces exerted by the substrate holder on the positioning device during comparatively fast displacements between two exposure steps are not transmitted into the frame of the lithographic device but are converted into displacements of the balancing unit of the positioning device. The frame of the lithographic device, which supports the mask holder, the focusing unit, and the substrate holder, thus remains substantially free from mechanical vibrations which could be caused by said reaction forces. The accuracy with which the substrate holder can be positioned relative to the mask holder and the focusing unit, and the time required for positioning the substrate holder with the desired accuracy are thus not adversely affected by such mechanical vibrations.

A special embodiment of a lithographic device according to the invention is characterized in that the mask holder is displaceable relative to the focusing unit parallel to the X-direction by means of a further positioning device. In this special embodiment of a lithographic device according to the invention, the semiconductor substrate to be manufactured is not in a constant position relative to the mask and the focusing unit during the exposure of an individual field of the semiconductor substrate, but the semiconductor substrate and the mask are displaced in synchronity parallel to the X-direction relative to the focusing unit by means of the positioning device of the substrate holder and the further positioning device of the mask holder, respectively, during the exposure. The pattern present on the mask is scanned parallel to the X-direction in this manner and synchronously imaged on the semiconductor substrate. It is achieved thereby that a maximum surface area of the mask which can be imaged on the semiconductor substrate through the focusing unit is limited to a lesser extent by a size of an aperture of the focusing unit.

A further embodiment of a lithographic device according to the invention is characterized in that the further positioning device is provided with a further X-actuator having a first part and a second part which are displaceable relative to one another and which exert a driving force on one another during operation, said first part of the further X-actuator being coupled to the mask holder, seen parallel to the X-direction, and said second part of the further X-actuator being coupled to a further balancing unit, seen parallel to the X-direction, which further balancing unit is displaceable relative to the frame along a further guide which is fastened to the frame and which extends parallel to the X-direction. Since the detail dimensions of the integrated semiconductor circuits to be manufactured lie in the submicron range, the semiconductor substrate and the mask should be displaced with an accuracy also in the submicron range relative to the focusing unit during the exposure. To reduce the time required for the manufacture of the semiconductor circuits, moreover, the semiconductor substrate and the mask should be displaced and positioned relative to one another with a comparatively high speed during the exposure. Since the pattern present on the mask is imaged on the semiconductor substrate on a reduced scale, the speed with which and the distance over which the mask is displaced are greater than the speed with which and the distance over which the semiconductor substrate is displaced, the ratio between said speeds and the ratio between said distances both being equal to a reduction factor achieved by the focusing unit. The fact that the further positioning device of the mask holder is also provided with a balancing unit has the result that comparatively strong reaction forces exerted by the mask holder on the further positioning device of the mask holder as a result of the comparatively high speeds and accelerations of the mask holder during the exposure of the semiconductor substrate are not transmitted into the frame of the lithographic device but are converted into displacements of the balancing unit of the further positioning device of the mask holder. The frame of the lithographic device, which supports the mask holder, the focusing unit, and the substrate holder, as a result also remains substantially free from mechanical vibrations which could arise from the reaction forces of the further positioning device. The accuracy with which the substrate holder and the mask holder are displaceable relative to the focusing unit during the exposure of the semiconductor substrate is thus not adversely affected by said mechanical vibrations.

BRIEF DESCRIPTION OF THE DRAWINGS

The invention will be explained in more detail below with reference to the drawing, in which FIG. 6 is a plan view of a third embodiment of a positioning device according to the invention suitable for use in the lithographic device of FIG. 1, and FIG. 7 is a diagrammatic plan view of a further positioning device which is suitable for the displacement of a mask holder in a lithographic device which operates by the "step and scan" principle.

DETAILED DESCRIPTION

Figure 1:
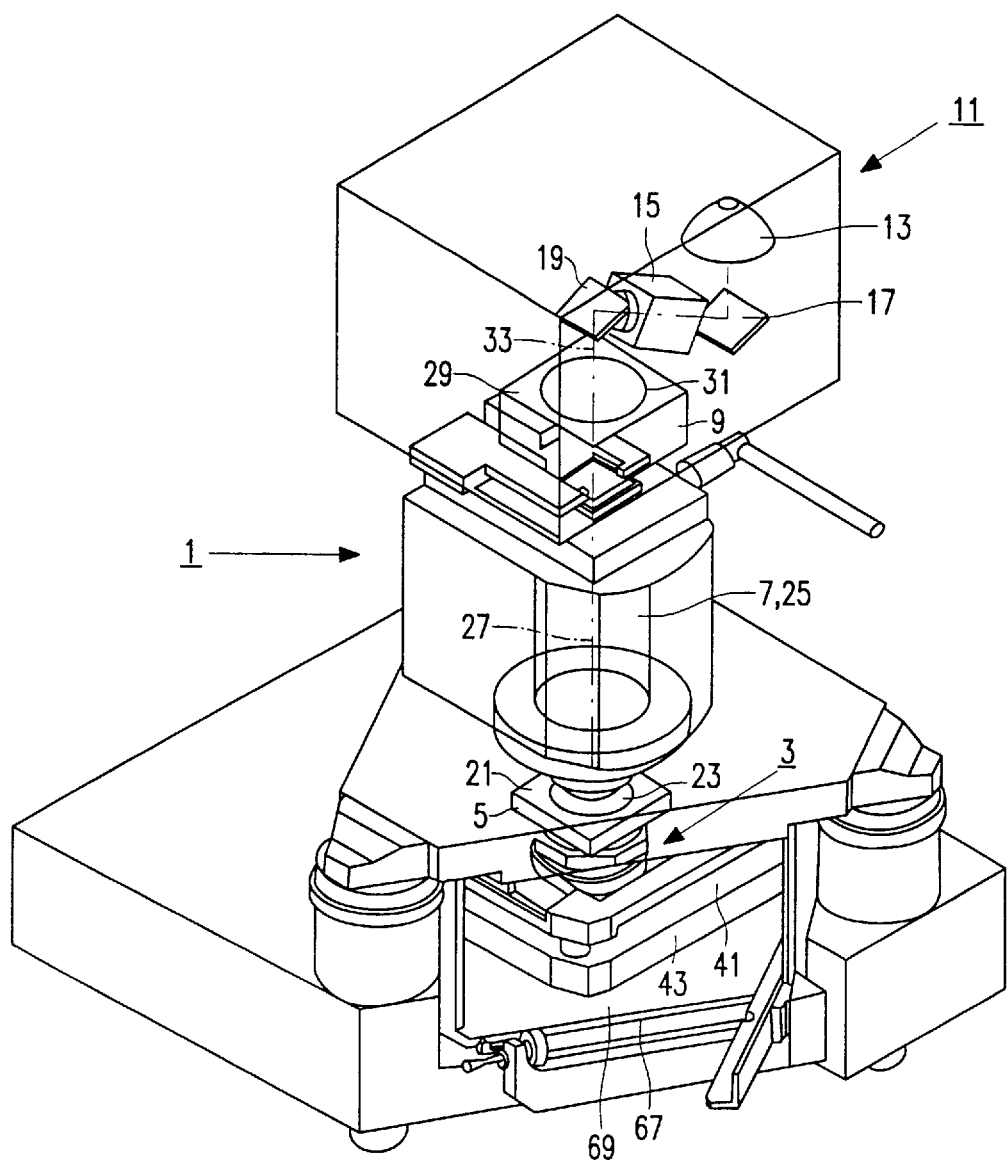
FIG. 1 shows a lithographic device according to the invention.
Figure 1:
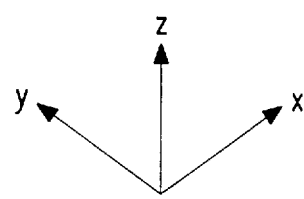

The lithographic device according to the invention shown in FIG. 1 is used for the manufacture of integrated semiconductor circuits in an optical lithographic process and by means of an imaging method following the so-called "step and repeat" principle. As FIG. 1 shows, the lithographic device is provided with a frame 1 which supports, in that order and seen parallel to a vertical Z-direction, a positioning device 3 with a substrate holder 5, a focusing unit 7, a mask holder 9, and a radiation source 11. The lithographic device shown in FIG. 1 is an optical lithographic device in which the radiation source 11 comprises a light source 13, a diaphragm 15, and mirrors 17 and 19. The substrate holder 5 comprises a support surface 21 which extends perpendicularly to the Z-direction and on which a semiconductor substrate 23 can be placed. The substrate holder 5 is displaceable relative to the focusing unit 7 parallel to an X-direction perpendicular to the Z-direction and parallel to a Y-direction which is perpendicular to the X-direction and to the Z-direction by means of the positioning device 3. The focusing unit 7 is an imaging or projection system and comprises an optical lens system 25 with an optical main axis 27 directed parallel to the Z-direction and an optical reduction factor which is, for example, 4 or 5. The mask holder 9 comprises a support surface 29 which extends perpendicularly to the Z-direction and on which a mask 31 can be placed. The mask 31 comprises a pattern or a sub-pattern of an integrated semiconductor circuit. During operation, a light beam 33 originating from the light source 9 is conducted through the mask 31 via the diaphragm 15 and the mirrors 17, 19 and focused on the semiconductor substrate 23 by means of the lens system 25, so that the pattern present on the mask 31 is imaged on a reduced scale on the semiconductor substrate 23. The semiconductor substrate 23 comprises a large number of individual fields on which identical semiconductor circuits are provided. The fields of the semiconductor substrate 23 are consecutively exposed via the mask 31 for this purpose. The mask 31 and the semiconductor substrate 23 are each in a fixed position relative to the focusing unit 7 during the exposure of an individual field of the semiconductor substrate 23, while after the exposure of an individual field a next field is brought into position relative to the focusing unit 7 each time in that the substrate holder 5 is displaced parallel to the X-direction or the Y-direction by means of the positioning device 3. This process is repeated a number of times, each time with a different mask, so that complicated integrated semiconductor circuits with a layered structure are manufactured. The integrated semiconductor circuits to be manufactured by means of the lithographic device have a structure with detail dimensions which lie in the submicron range. Since the semiconductor substrate 23 is exposed through a number of different, consecutive masks, the patterns present on the masks must be imaged relative to one another on the semiconductor substrate 23 with an accuracy which also lies in the submicron range, or even in the nanometer range. The semiconductor substrate 23, therefore, must be positioned with a similar accuracy relative to the mask 31 and the focusing unit 7 between two consecutive exposure steps, which means that very high requirements are imposed on the positioning accuracy of the positioning device 3.

Figure 2:
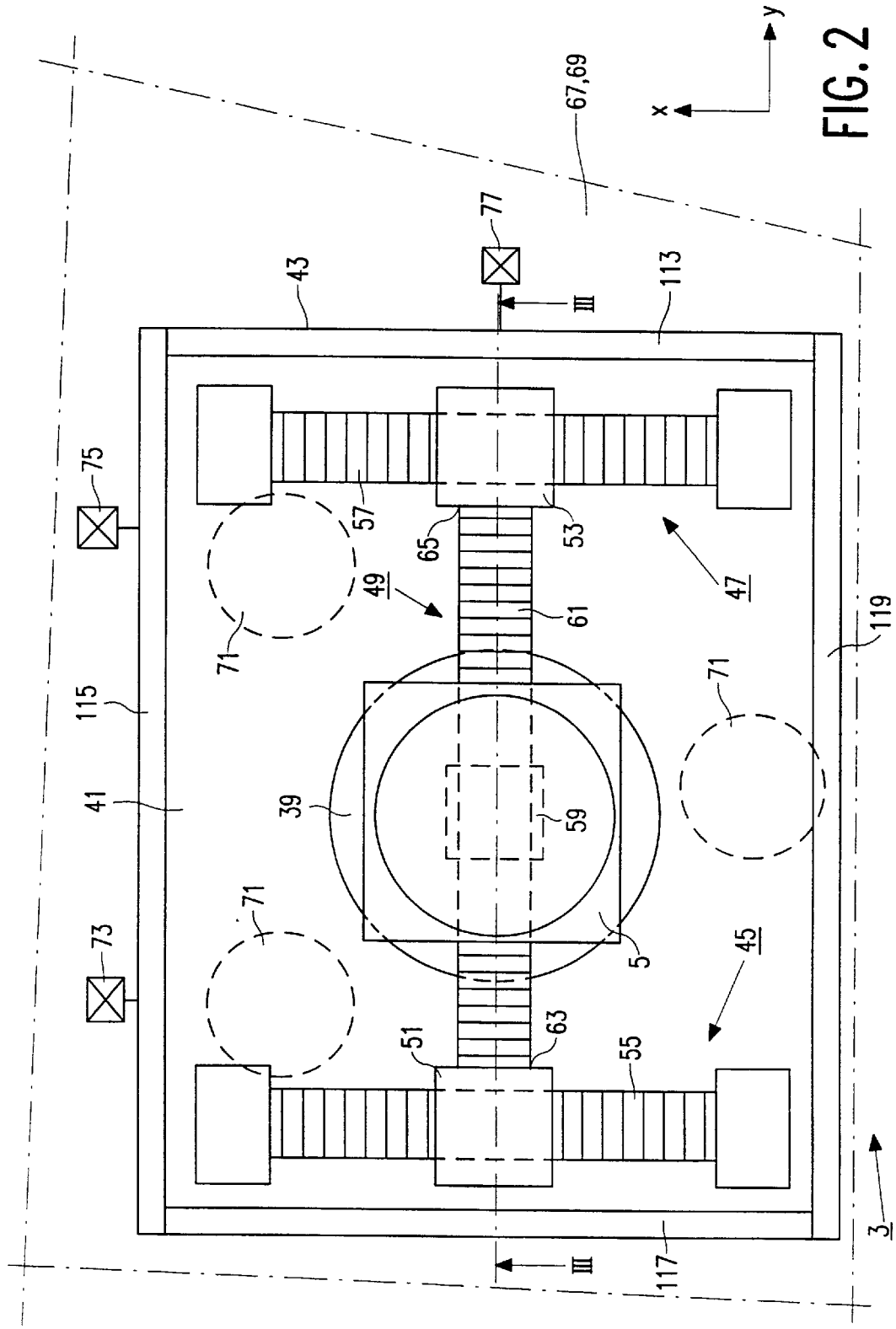
FIG. 2 is a plan view of a first embodiment of a positioning device according to the invention suitable for use in the lithographic device of FIG. 1.

As is shown in detail in FIG. 2, the substrate holder 5 of the positioning device 3 is guided over a first surface 41 of the positioning device 3, which surface extends parallel to the X-direction and parallel to the Y-direction, by means of a so-called aerostatically supported foot 39 provided with a static gas bearing. The first surface 41 forms a first guide of the positioning device 3 and is an upper surface of a support body 43 which takes the form of a granite slab. The substrate holder 5 is displaceable over the first surface 41 by means of two X-actuators 45, 47 and a Y-actuator 49, each of these being constructed as a linear electric motor. The two X-actuators 45, 47 each comprise a first part 51, 53 and a second part 55, 57. The second parts 55, 57 are fastened to the support body 43 and are each constructed as a stator extending parallel to the X-direction and provided with an electric coil system. The first parts 51, 53 are each constructed as a translator provided with a set of permanent magnets and displaceably guided along the relevant second part 55, 57. The Y-actuator 49 comprises a first part 59 and a second part 61. The second part 61 comprises a stator which extends substantially parallel to the Y-direction and which is provided with an electric coil system. Near a first end 63, the second part 61 is fastened to the first part 51 of the X-actuator 45, while the second part 61 is fastened to the first part 53 of the X-actuator 47 near a second end 65. The first part 59 is fastened to the substrate holder 5 and is constructed as a translator provided with a set of permanent magnets and displaceably guided along the second part 61. The substrate holder 5 is displaceable parallel to the X-direction in that the two X-actuators 45, 47 are activated in the same manner, while the substrate holder 5 is displaceable parallel to the Y-direction through activation of the Y-actuator 49. It is noted that the second part 61 of the Y-actuator 49 in a special embodiment is fastened to the first parts 51, 53 of the X-actuators 45, 47 in a manner such that the second part 61 of the Y-actuator 49 is rotatable relative to the first parts 51, 53 of the X-actuators 45, 47 through limited angles about an axis of rotation directed parallel to the Z-direction. The substrate holder 5 in this special embodiment is in addition rotatable through small angles about an axis of rotation directed parallel to the Z-direction in that the X-actuators 45, 47 are activated in mutually opposed directions.

As FIGS. 1 and 2 further show, the frame 1 of the lithographic device comprises a carrier 67 which supports the support body 43. The carrier 67 comprises a plate which extends perpendicularly to the Z-direction and which is provided with an upper surface 69 which extends perpendicularly to the Z-direction. As is depicted diagrammatically in FIG. 2, the support body 43 is provided near a lower side thereof with three static gas bearings 71 by means of which the support body 43 is displaceably guided parallel to the X-direction and parallel to the Y-direction along the upper surface 69 of the carrier 67. The carrier 67 forms a base of the positioning device 3, while the support body 43 forms a balancing unit of the positioning device 3 whose function will be described in more detail further below. The upper surface 69 of the carrier 67 also forms a second guide of the positioning device 3, which second guide comprises a second surface of the positioning device 3 which extends parallel to the X-direction and parallel to the Y-direction.

The substrate holder 5 forms a displaceable unit of the positioning device 3 which is displaceable relative to the base of the positioning device 3 over the first surface 41 by means of the two X-actuators 45, 47 and the Y-actuator 49. For this purpose, the first parts 51, 53 and the second parts 55, 57 of the X-actuators 45, 47 exert driving forces on one another during operation which are substantially parallel to the X-direction, whereas the first part 59 and the second part 61 of the Y-actuator 49 exert driving forces on one another which are substantially parallel to the Y-direction. As a result of this, the second parts 55, 57 of the X-actuators 45, 47 exert a reaction force on the support body 43 which is directed substantially parallel to the X-direction and which has a value equal to a value of the driving force of the X-actuators 45, 47 and a direction opposed to a direction of the driving force of the X-actuators 45, 47. The second part 61 of the Y-actuator 49 exerts on the X-actuators 45, 47 a reaction force which is substantially parallel to the Y-direction and which has a value substantially equal to a value of the driving force of the Y-actuator 49 and a direction opposed to a direction of the driving force of the Y-actuator 49. The reaction force of the Y-actuator is transmitted to the support body 43 through the first parts 51, 53 and the second parts 55, 57 of the X-actuators 45, 47. Since the support body 43 is a balancing unit of the positioning device 3 and is displaceably guided along the upper surface 69 of the carrier 67 parallel to the X-direction and parallel to the Y-direction, the reaction forces of the X-actuators 45, 47 and the Y-actuator 49 are not transmitted further to the carrier 67 and the frame 1 of the lithographic device but are utilized for displacing the support body 43 along the upper surface 69 relative to the carrier 67. The displacements of the support body 43 generated in this manner have a direction opposed to a direction in which the substrate holder 5 is displaced. The reaction force compensation thus provided is called an inertial reaction force compensation, where a value of the displacement of the balancing unit is a function of a value of the reaction force and a value of a displaceable mass of the balancing unit. Since the reaction forces are not transmitted into the frame 1 of the lithographic device but are converted substantially completely into displacements of the balancing unit, the frame 1 remains substantially free from mechanical vibrations which could be caused by said reaction forces. The accuracy with which the substrate holder 5 can be positioned relative to the focusing unit 7 and the mask holder 9 is thus not adversely affected by such mechanical vibrations. The above inertial reaction force compensation effect is independent of the value of the displaceable mass of the displaceable unit of the positioning device 3. As a result of this, mass variations of the semiconductor substrates 23 under treatment have no influence on the reaction force compensation effect, so that the reaction force compensation effect is an optimum for each and every type of semiconductor substrate 23 to be processed.

As was described above, the support body 43 forms a common balancing unit for the two X-actuators 45, 47 and for the Y-actuator 49. The support body 43 is guided over the upper surface 69 of the carrier 67 by means of the static gas bearings 71, so that the common balancing unit is displaceable along the upper surface 69 parallel to the X-direction under the influence of reaction forces of the X-actuators 45, 47, and is displaceable along the upper surface 69 parallel to the Y-direction under the influence of reaction forces of the Y-actuator 49. An inertial reaction force compensation for two different directions is achieved in this manner by means of a simple construction. The support body 43 is in addition rotatable over the upper surface 69 about an axis of rotation directed parallel to the Z-direction, so that also a reaction moment can be compensated for which arises when the two X-actuators 45, 47 are activated in mutually opposed directions for obtaining a rotation of the substrate holder 5 about an axis of rotation which is parallel to the Z-direction. It will be explained below, however, that said rotation possibility of the support body 43 will not be utilized for certain reasons to be explained in detail. The simplicity of the construction described in addition arises from the fact that the support body 43 has a dual function. The support body 43 in fact forms a support for the substrate holder 5 along which the substrate holder 5 is displaceably guided. In addition, the support body 43 forms the balancing unit referred to above, by means of which the inertial reaction force compensation of the positioning device 3 is achieved.

As was described above, the support body 43 is guided over the upper surface 69 of the carrier 67 by means of static gas bearings 71. A substantially frictionless guiding of the support body 43 over the upper surface 69 is obtained thereby, so that the displacements of the support body 43 under the influence of the reaction forces and the inertial reaction force compensation of the positioning device 3 are not interfered with by frictional forces occurring between the support body 43 and the upper surface 69. Since substantially no further external forces, apart from the force of gravity, act on the positioning device 3, which also comprises the substrate holder 5 and the support body 43, the positioning device 3 is provided with three so-called anti-drift actuators 73, 75 and 77 which are depicted diagrammatically only in FIG. 2 and which are shown in detail in FIG. 4. The anti-drift actuators 73, 75, 77 are fastened to the carrier 67 such that the anti-drift actuators 73 and 75 each exert an anti-drift force on the support body 43 parallel to the X-direction and the anti-drift actuator 77 exerts an anti-drift force on the support body 43 parallel to the Y-direction. The anti-drift actuators 73, 75, 77 are controlled by means of a control unit which is not shown in the Figures and which is provided with position sensors, also not shown in the Figures, for measuring an average position of the support body 43 parallel to the X-direction and parallel to the Y-direction. The anti-drift actuators 73, 75, 77 are so controlled that the support body 43 occupies a substantially constant average position parallel to the X-direction and parallel to the Y-direction. The use of the anti-drift actuators 73, 75, 77 prevents the support body 43 from drifting towards an edge of the carrier 67, where the support body 43 has insufficient freedoms of displacement, under the influence of external interfering forces. Such an external interfering force arises, for example, if the upper surface 69 of the carrier 67 is not positioned perfectly horizontally, as a result of which a small component of the force of gravity directed parallel to the upper surface 69 would be acting on the support body 43.

Figure 4:
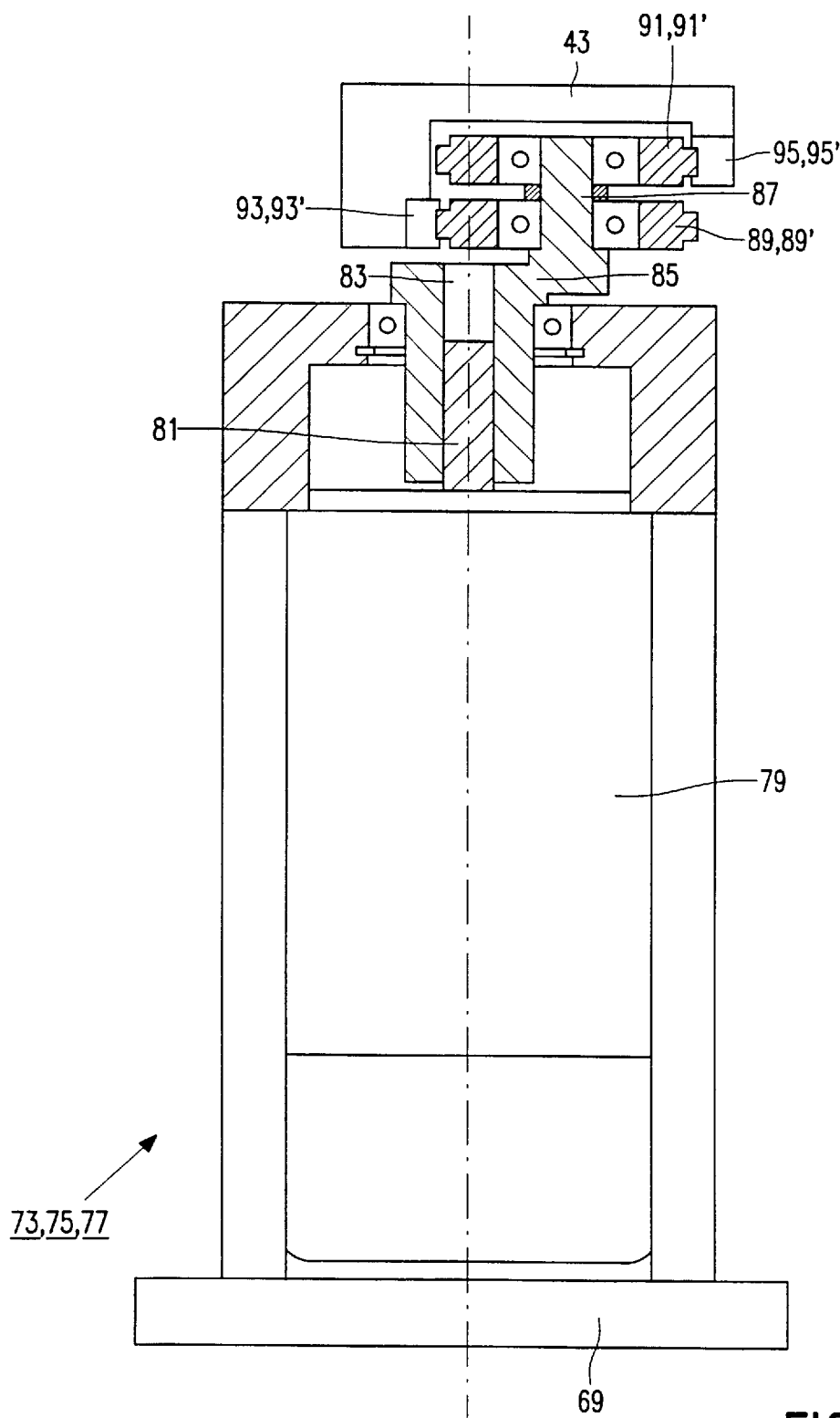
FIG. 4 shows an anti-drift actuator of the positioning device of FIG. 2 in detail.

As FIG. 4 shows in detail, the anti-drift actuators 73, 75, 77 each comprise an electric servomotor 79 with a drive shaft 81 extending parallel to the Z-direction. An eccentric piece 85 is fastened to an end 83 of the drive shaft 81 and is provided with a bearing pin 87 which is positioned eccentrically with respect to the drive shaft 81. Two rollers 89 and 91 are rotatably supported around the bearing pin 87. The eccentric rollers 89, 91 of the anti-drift actuators 73, 75 for the X-direction are guided between two guide rails 93, 95 which extend parallel to the Y-direction and which are fastened to the support body 43, while the eccentric rollers 89', 91' of the anti-drift actuator 77 for the Y-direction are guided between two guide rails 93', 95' which extend parallel to the X-direction and which are also fastened to the support body 43. When the eccentric rollers 89, 91 and 89', 91' are rotated, the anti-drift actuators 73, 75 and the anti-drift actuator 79 exert an anti-drift force directed parallel to the X-direction on the guide rails 93, 95 and an anti-drift force directed parallel to the Y-direction on the guide rails 93', 95', respectively. Since said external interfering forces which may cause a drifting movement of the support body 43 are comparatively small during operation, the above anti-drift forces are also comparatively small, so that the anti-drift actuators 73, 75, 77 exert only slight reaction forces on the frame 1 of the lithographic device. Such slight reaction forces do not lead to appreciable mechanical vibrations of the frame 1 during operation.

Figure 3:
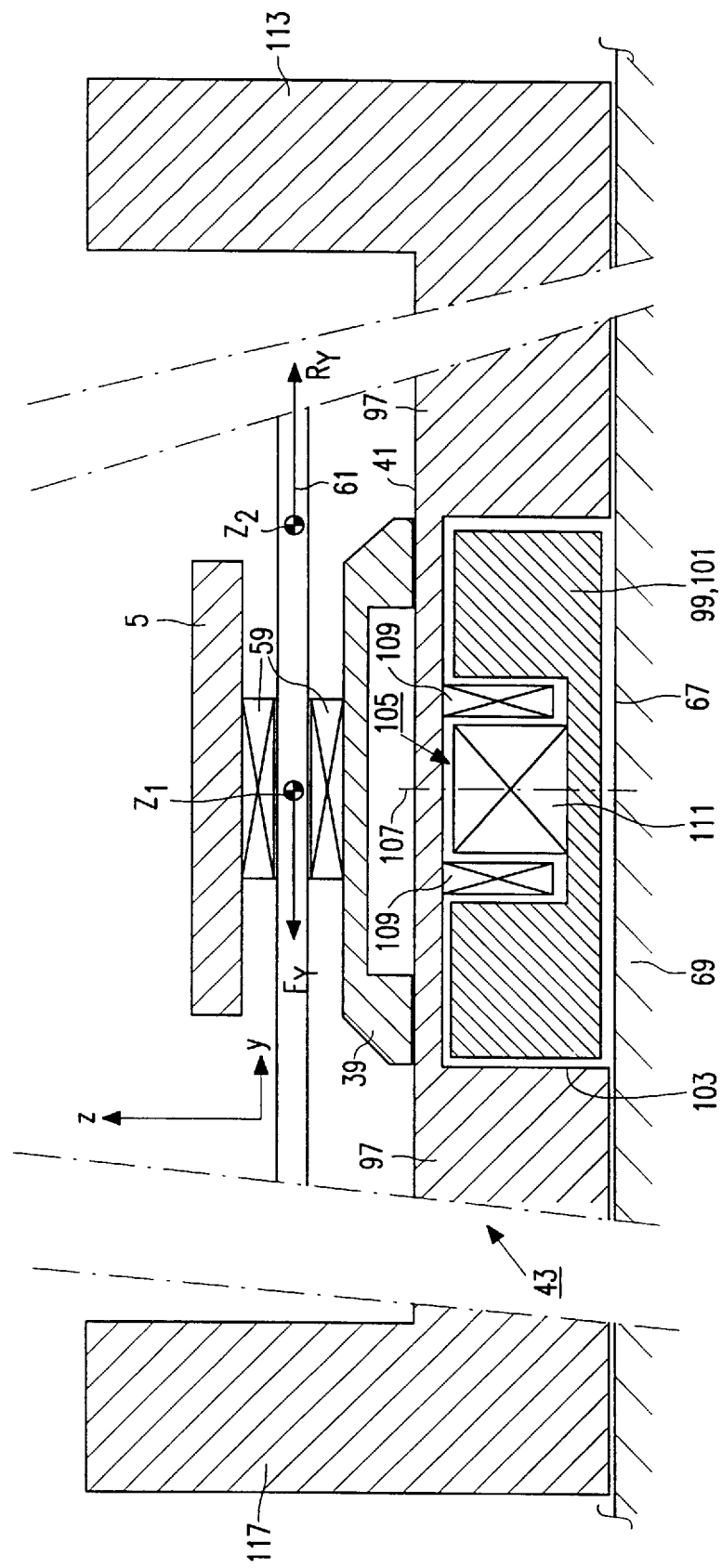
FIG. 3 is a diagrammatic cross-section taken on the line III—III in FIG. 2.

If the substrate holder 5 is displaced by the X-actuators 45, 47 or the Y-actuator 49, the X-actuators 45, 47 and the Y-actuator 49 exert on the support body 43 not only a reaction force but also a reaction moment. The center of gravity of the support body 43 is displaced under the influence of the reaction force, whereas the support body 43 is rotated about an axis of rotation directed parallel to the Z-direction and passing through the center of gravity of the support body 43 under the influence of said reaction moment. If the substrate holder 5 is displaced from a starting position over a predetermined path and at the end of the path returns to the starting position again, the center of gravity of the support body 43 will also return, at the end of the path of the substrate holder 5, into a position in which the center of gravity of the support body 43 was at the beginning of the path of the substrate holder 5. Small deviations between a starting position and an end position of the support body 43 are prevented through the use of the anti-drift actuators 73, 75, 77, as described above. Without further measures being taken, however, an angle of rotation of the support body 43 about said axis of rotation through the center of gravity of the support body 43 at the end of the path of the substrate holder 5 will in general not correspond to an angle of rotation of the support body 43 about said axis of rotation at the start of said path. Such rotations of the support body 43 under the influence of the reaction moment of the X-actuators 45, 47 and the Y-actuator 49 are undesirable and cannot be compensated for by means of the comparatively small anti-drift forces of the anti-drift actuators 73, 75, 77. The support body 43 as shown in FIG. 3 is provided with a first balancing part 97 and a second balancing part 99 for the purpose of preventing said undesirable rotations of the support body 43. The second parts 55, 57 of the X-actuators 45, 47 are fastened to the first balancing part 97 which comprises the first surface 41. The second balancing part 99 comprises a flywheel 101 which is positioned in a recess 103 in the lower side of the first balancing part 97. The second balancing part 99 is rotatable relative to the first balancing part 97 about an axis of rotation 107 extending parallel to the Z-direction by means of a rotation motor 105. The rotation motor 105 comprises a first part 109 which is fastened to the first balancing part 97 and a second part 111 which is fastened to the second balancing part 99. If the second balancing part 99 is rotated relative to the first balancing part 97 by the rotation motor 105, the second part 111 of the rotation motor 105 exerts a driving moment on the second balancing part 99, while the first part 109 of the rotation motor 105 exerts a reaction moment on the first balancing part 97. The rotation motor 105 is controlled by a control unit of the lithographic device which is not shown in the Figures and which also controls the X-actuators 45, 47 and the Y-actuator 49. If the substrate holder 5 is displaced by means of the X-actuators 45, 47 and the Y-actuator 49, said control unit will calculate a value of a reaction moment exerted by the X-actuators 45, 47 and the Y-actuator 49 on the first balancing part 97 of the support body 43 during the displacement of the substrate holder 5. The rotation motor 105 is so controlled by said control unit that the first part 109 of the rotation motor 105 exerts a reaction moment on the first balancing part 97 whose value corresponds to the value of the reaction moment of the X-actuators 45, 47 and the Y-actuator 49 but whose direction is opposed to the direction of the reaction moment of the X-actuators 45, 47 and the Y-actuator 49. The reaction moment of the X-actuators 45, 47 and the Y-actuator 49 is thus compensated for by the reaction moment of the rotation motor 105. The driving moment exerted by the rotation motor 105 on the second balancing part 99 is converted into a rotation of the second balancing part 99 about the axis of rotation 107, so that said driving moment is not transmitted to the frame 1 of the lithographic device and accordingly causes no undesirable vibrations of the frame 1.

As FIGS. 2 and 3 further show, the first surface 41 of the support body 43 is bounded by four raised walls 113, 115, 117 and 119 of the support body 43. It is noted that the walls 113 and 117 only are visible in cross-section in FIG. 3. The use of the raised walls 113, 115, 117 and 119 achieves that a center of gravity $Z_1$ of the displaceable unit of the positioning device 3 and a center of gravity $Z_2$ of the balancing unit of the positioning device 3 occupy substantially identical positions when viewed in a direction parallel to the Z-direction. In addition, the driving forces $F_X$, $F_Y$ and the reaction forces $R_X$, $R_Y$ of the X-actuators 45, 47 and the Y-actuator 49 lie in a plane through the center of gravity $Z_1$ of the displaceable unit and the center of gravity $Z_2$ of the balancing unit and directed parallel to the X-direction and the Y-direction. The driving force $F_Y$ and the reaction force $R_Y$ only are shown in FIG. 3. It is achieved in this manner that no moments of force are exerted on the displaceable unit and on the balancing unit about an axis passing through the center of gravity $Z_1$ of the displaceable unit and perpendicular to the Z-direction and about an axis passing through the center of gravity $Z_2$ of the balancing unit and perpendicular to the Z-direction, respectively. Such moments are undesirable because these moments cannot be converted into displacements of the balancing unit but will be transmitted into the frame 1 of the lithographic device via the first surface 41 and the second surface (upper surface 69), thus causing vibrations in the frame 1. The use of the raised walls 113, 115, 117 and 119 provides the desired position of the center of gravity $Z_2$ of the balancing unit seen parallel to the Z-direction in a simple and effective manner.

Figure 5:
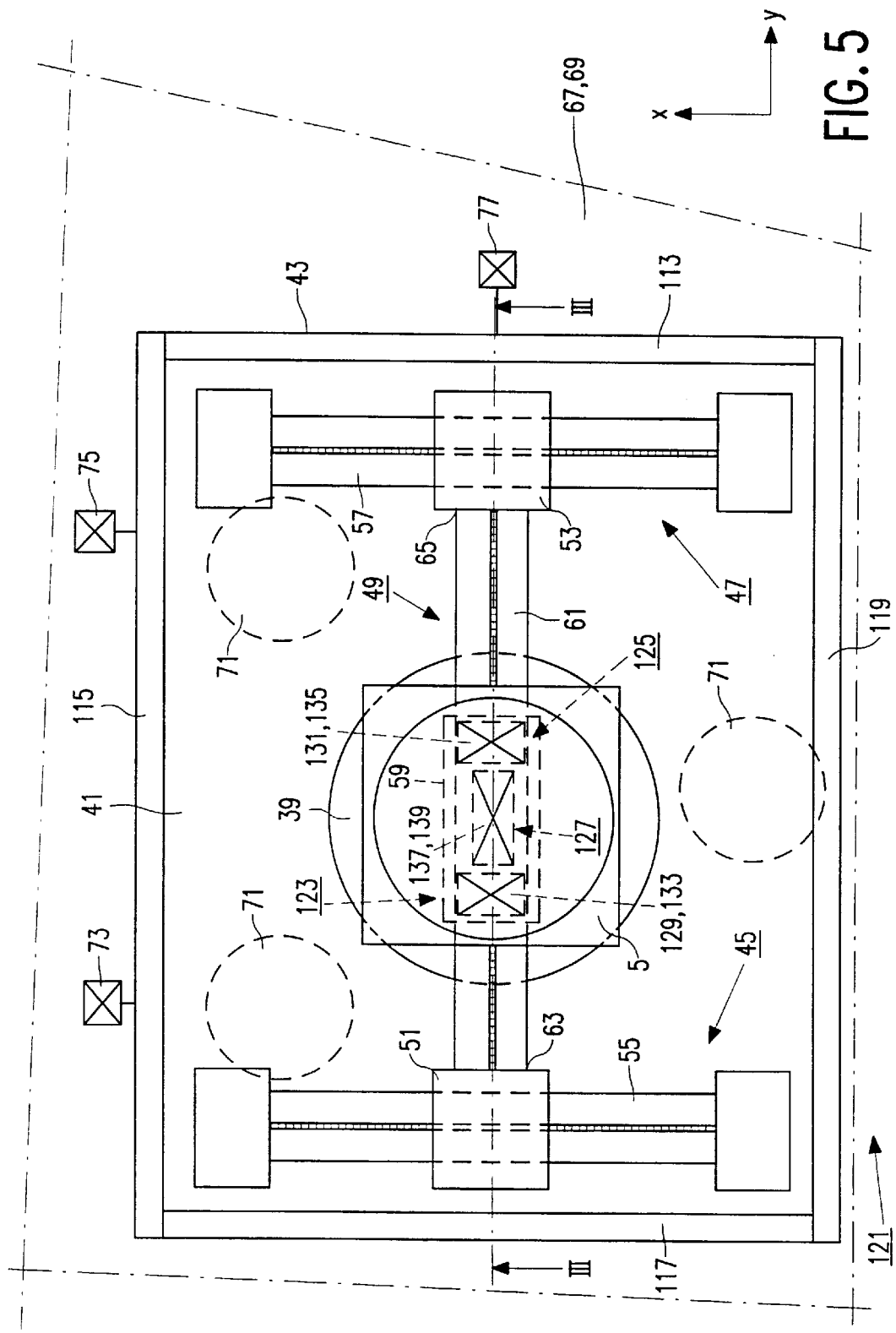
FIG. 5 is a plan view of a second embodiment of a positioning device according to the invention suitable for use in the lithographic device of FIG. 1.

In the positioning device 3 described above, the second parts 55, 57 of the two X-actuators 45, 47 are fastened to the balancing unit (the support body 43), and the first part 59 of the Y-actuator 49 is fastened to the displaceable unit (substrate holder 5). Furthermore, the second part 61 of the Y-actuator 49 is fastened to the two first parts 51, 53 of the X-actuators 45, 47. The Y-actuator 49 is thus displaceable in its entirety parallel to the X-direction by means of the X-actuators 45, 47. Reaction forces of the Y-actuator 49 are transmitted through the X-actuators 45, 47 into the support body 43 which forms a balancing unit common to the X-actuators 45, 47 and the Y-actuator 49. The invention may also be applied, however, to positioning devices in which a different type of X-actuator and a different type of Y-actuator is used, or in which the X-actuator and the Y-actuator are positioned in a different manner. FIG. 5 shows a second embodiment of a positioning device 121 according to the invention which is suitable for use in the lithographic device described above instead of the positioning device 3. The positioning device 121 is known per se from EP-A-0 421 527, in which document further details and the operation of the positioning device 121 are described. Components of the positioning device 121 corresponding to components of the positioning device 3 have been given the same reference numerals in FIG. 5. The positioning device 121 again comprises two X-actuators 45, 47 and a Y-actuator 49 which are constructed as linear spindle motors. The second parts 55, 57 of the X-actuators 45, 47 are fastened to the support body 43, while the second part 61 of the Y-actuator 49 is fastened to the first parts 51, 53 of the X-actuators 45, 47. Unlike the positioning device 3, the positioning device 121 is provided with two further X-actuators 123, 125 and a further Y-actuator 127 which are constructed as electromagnetic Lorentz force motors. The further X-actuators 123, 125 each comprise a first part 129, 131 which is fastened to the substrate holder 5 and a second part 133, 135 which is fastened to the first part 59 of the Y-actuator 49. The further Y-actuator 127 comprises a first part 137 which is fastened to the substrate holder 5 and a second part 139 which is fastened to the first part 59 of the Y-actuator 49. The substrate holder 5 is displaceable parallel to the X-direction and parallel to the Y-direction over comparatively great distances and with comparatively low accuracies by means of the X-actuators 45, 47 and the Y-actuator 49, during which the substrate holder 5 is taken along relative to the first part 59 of the Y-actuator 49 by Lorentz forces of the further X-actuators 123, 125 and the further Y-actuator 127. Furthermore, the substrate holder 5 is displaceable relative to the first part 59 of the Y-actuator 49 parallel to the X-direction and parallel to the Y-direction over comparatively small distances and with comparatively high accuracies by means of the further X-actuators 123, 125 and the further Y-actuator 127, and is rotatable through small angles about an axis of rotation which is perpendicular to the X-direction and the Y-direction. A positioning of the substrate holder 5 in two steps is achieved in this manner by means of the positioning device 121, with a first, coarse step and a second, fine step. Reaction forces of the further X-actuators 123, 125 and the further Y-actuator 127 are transmitted to the support body 43 via the Y-actuator 49 and the two X-actuators 45, 47, which support body thus forms a common balancing unit for the two X-actuators 45, 47, the Y-actuator 49, the two further X-actuators 123, 125, and the further Y-actuator 127.

FIG. 6 shows a third embodiment of a positioning device 141 according to the invention suitable for use in the lithographic device described above instead of the positioning device 3. The positioning device 141 is also known per se from EP-A-0 421 527 in which further details and the operation of the positioning device 141 are described. Components of the positioning device 141 corresponding to components of the positioning device 121 described above have been given the same reference numerals in FIG. 6. The positioning device 141 comprises, as does the positioning device 121, two X-actuators 45, 47 which are constructed as linear spindle motors. Unlike the positioning device 121, the positioning device 141 comprises two Y-actuators 49 and 49' which are also constructed as linear spindle motors. The second parts 55, 57 of the two X-actuators 45, 47 and the second parts 61, 61' of the two Y-actuators are fastened to the support body 43. The X-actuators 45, 47 each have a first part 51, 53 which is displaceable parallel to the X-direction relative to the corresponding second part 55, 57. The Y-actuators 49, 49' each have a first part 59, 59' which is displaceable parallel to the Y-direction relative to the corresponding second part 61, 61'. The first parts 51, 53 of the X-actuators 45, 47 are interconnected by means of two guides 143 and 143' which extend parallel to the Y-direction, while the first parts 59, 59' of the Y-actuators 49, 49' are interconnected by means of two guides 145 and 145' which extend parallel to the X-direction. The positioning device 141 comprises, as does the positioning device 121, two further X-actuators 123, 125 and a further Y-actuator 127 which are constructed as electromagnetic Lorentz force motors. The first parts 129 and 131 of the further X-actuators 123, 125 and the first part 137 of the further Y-actuator 127 are fastened to the substrate holder 5, which is not shown in FIG. 6 for simplicity s sake. The second parts 133, 135 of the further X-actuators 123, 125 and the second part 139 of the further Y-actuator 127 are fastened on a common carrier 147 which is guided along the guides 143 and 143' of the X-actuators 45, 47 by means of wheels 149 and is guided along the guides 145 and 145' of the Y-actuators 49, 49' by means of wheels 151. The second parts 133, 135 of the further X-actuators 123, 125 and the second part 139 of the further Y-actuator 127 are thus coupled to the first parts 51, 53 of the X-actuators 45, 47 by means of the wheels 149 and the guides 143 and 143', as seen parallel to the X-direction, and are coupled to the first parts 59, 59' of the Y-actuators 49, 49' by means of the wheels 151 and the guides 145 and 145', as seen parallel to the Y-direction. The substrate holder 5 is displaceable parallel to the X-direction and parallel to the Y-direction over comparatively great distances and with comparatively low accuracies by means of the X-actuators 45, 47 and the Y-actuator 49, and is carried along by Lorentz forces of the further X-actuators 123, 125 and the further Y-actuator 127 relative to the first parts 51, 53 of the X-actuators 45, 47 and the first parts 59, 59' of the Y-actuators 49, 49'. Furthermore, the substrate holder 5 is displaceable relative to the first parts 51, 53 of the X-actuators 45, 47 and the first parts 59, 59' of the Y-actuators 49, 49' parallel to the X-direction and parallel to the Y-direction over comparatively small distances and with comparatively high accuracies by means of the further X-actuators 123, 125 and the further Y-actuator 127, and is rotatable through small angles about an axis of rotation directed perpendicularly to the X-direction and the Y-direction. The positioning device 141, like the positioning device 121, thus provides a positioning of the substrate holder 5 in two steps, with a first, coarse step and a second, fine step. Reaction forces of the X-actuators 45, 47 and the Y-actuators 49, 49' are directly transmitted to the support body 43. Reaction forces of the further X-actuators 123, 125 directed parallel to the X-direction are transmitted to the support body 43 via the guides 143, 143' and the X-actuators 45, 47, while reaction forces of the further Y-actuator 127 directed parallel to the Y-direction are transmitted to the support body 43 via the guides 145, 145' and the Y-actuators 49, 49'. The support body 43 thus constitutes a common balancing unit for the two X-actuators 45, 47, the Y-actuator 49, the two further X-actuators 123, 125, and the further Y-actuator 127 also in the positioning device 141.

As was described above, the second parts 55 and 57 of the X-actuators 45 and 47 in the positioning devices 3, 121 and 141 are directly fastened to the balancing unit (the support body 43). In the positioning devices 3, 121 and 141, however, the first parts 51 and 53 of the X-actuators 45 and 47 are not directly fastened to the displaceable unit (the substrate holder 5). The driving forces exerted on the first parts 51 and 53 of the X-actuators 45, 47 in the positioning device 3 are transmitted to the substrate holder 5 via the second part 61 and the first part 59 of the Y-actuator 49, so that the first parts 51 and 53 of the X-actuators 45, 47 are coupled to the displaceable unit via the Y-actuator 49 parallel to the X-direction. It is accordingly noted that the expressions "coupled to . . . seen parallel to the X-direction" and "coupled to . . . seen parallel to the Y-direction" used in the claims cover constructions in which the one part is directly fastened to the other part as well as constructions in which there is no direct fastening of the one part to the other part but where a mechanical or some other physical coupling between the relevant parts is achieved such that a force coupling can take place between the relevant parts parallel to the relevant direction. Thus, for example, the second part 61 of the Y-actuator 49 in the positioning device 3 is coupled to the balancing unit (the support body 43), seen parallel to the Y-direction, i.e. via the first parts 51, 53 and the second parts 55, 57 of the X-actuators 45, 47, so that reaction forces of the Y-actuator 49 directed parallel to the Y-direction can be transmitted to the balancing unit. In the positioning device 141, for example, the first parts 51, 53 of the X-actuators 45, 47 are coupled to the displaceable unit (the substrate holder 5), seen parallel to the X-direction, i.e. via the guides 143 and 143', the wheels 149, the common carrier 147, and the Lorentz forces of the further X-actuators 123 and 125, so that driving forces of the X-actuators 45, 47 directed parallel to the X-direction can be transmitted to the displaceable unit.

It is further noted that a positioning device according to the invention can be used not only in a lithographic device in which the semiconductor substrates under manufacture are exposed in accordance with the "step and repeat" principle, such as the lithographic device shown in FIG. 1, but also in a lithographic device in which the semiconductor substrates under manufacture are exposed in accordance with the so-called "step and scan" principle. In a lithographic device operating by the "step and scan" principle, the mask holder is displaceable, for example parallel to the X-direction, relative to the focusing unit by means of a further positioning device. The semiconductor substrate to be exposed and the mask are synchronously displaced relative to the focusing unit parallel to the X-direction during the exposure step, so that the mask is scanned parallel to the X-direction and the mask pattern is imaged on an individual field of the semiconductor substrate in a scanning movement. After one scanning movement of the mask and the semiconductor substrate, a next field of the semiconductor substrate is brought into position with respect to the focusing unit, whereupon the mask and the semiconductor substrate perform a next scanning movement while the mask and the semiconductor substrate are being exposed. Since the pattern present on the mask is imaged on the semiconductor substrate on a reduced scale, the mask is to be moved at a higher speed relative to the focusing unit than the semiconductor substrate during the exposure, a ratio between the speeds of the mask and of the semiconductor substrate corresponding to a reduction factor of the focusing unit. As a result, the driving forces of the further positioning unit with which the mask holder is displaceable are usually much greater than the driving forces of the positioning unit with which the substrate holder is displaceable in such a lithographic device.

FIG. 7 diagrammatically shows a further positioning device 153 suitable for displacing a mask holder of a lithographic device which operates by the "step and scan" principle. Such a lithographic device is obtained, for example, in that the mask holder 9 in the lithographic device shown in FIG. 1 is replaced by the further positioning device 153 described below. As FIG. 7 shows, the further positioning device 153 is provided with two linear X-actuators 155 and 157, each having a first part 159, 161 which is displaceable under the influence of a driving force parallel to the X-direction relative to a respective second part 163, 165 which extends parallel to the X-direction. The first parts 159 and 161 are fastened to a mask holder 167 which is provided with a support surface 169 for a mask and with a central light passage 171, and which is guided along a first guide 173 extending parallel to the X-direction by means of static gas bearings. The second parts 163 and 165 are fastened to a further common balancing unit 175 which is constructed as a solid countermass. The balancing unit 175 and the second parts 163 and 165 of the X-actuators 155, 157 are guided substantially without friction along two further guides 179, 179', which extend parallel to the X-direction and are fastened to the frame 1 of the lithographic device, by means of static gas bearings 177 which are depicted diagrammatically only in FIG. 7. When the mask holder 167 is displaced parallel to the X-direction by the linear X-actuators 155 and 157 during operation, reaction forces of the X-actuators 155, 157 exerted on the second parts 163 and 165 are transmitted to the further balancing unit 175 and converted into displacements of this further balancing unit 175 along the further guides 179 and 179'. It is thus prevented, in the same manner as in the positioning devices 3, 121, 141 of the substrate holder 5, that the reaction forces of the X-actuators 155, 157 are transmitted to the frame 1 of the lithographic device. It is noted that the further positioning device 153, like the positioning devices 121 and 141, may be provided with a further X-actuator having a first part fastened to the mask holder 167 and a second part fastened to the first parts 159, 161 of the X-actuators 155, 157. A positioning of the mask holder 167 in two steps, with a first, coarse step and a second, fine step, is thus achieved also in the further positioning device 153.

The lithographic devices according to the invention as described above are used for exposing semiconductor substrates in the production of integrated electronic semiconductor circuits. It is noted that such a lithographic device may alternatively be used in the manufacture of other products provided with structures having detail dimensions in the submicron range, where mask patterns are imaged on a substrate by means of the lithographic device. Examples of this might be structures of integrated optical systems, or conduction and detection patterns of magnetic domain memories, or structures of liquid crystal display patterns.

It is further noted that a positioning device according to the invention can be used not only in a lithographic device but also in other devices in which objects or substrates are to be positioned in an accurate manner. Examples of this might be devices for analyzing or measuring objects or materials, where an object or material is to be accurately positioned or displaced relative to a measuring system or scanning system. Another application of a positioning device according to the invention is, for example, a precision machine tool by means of which workpieces, for example lenses, can be processed with accuracies in the submicron range. The positioning device according to the invention is then used for positioning the workpiece relative to a rotating tool, or for positioning a tool relative to the rotating workpiece.

In the positioning devices 3, 121, 141 according to the invention as described above, the balancing unit comprises the support body 43 on which the first surface 41 is provided, the displaceable unit (the substrate holder 5) being guided over this first surface. It is finally noted that, according to the invention, the balancing unit and the support body comprising the first surface may alternatively be separate components of the positioning device. As was described above, a simple and effective construction is provided in the positioning devices 3, 121, 141 as a result of the combined supporting and balancing functions of the support body 43.

What is claimed is:

1. A positioning device provided with a base and a displaceable unit which is displaceable relative to the base by means of an X-actuator along a first guide which extends parallel to an X-direction, which X-actuator comprises a first part and a second part which are displaceable relative to one another and which exert a driving force on one another during operation, the first part of the X-actuator being coupled to the displaceable unit, seen parallel to the X-direction, and the second part of the X-actuator being coupled to a balancing unit, seen parallel to the X-direction, which balancing unit is displaceable relative to the base along a second guide which is fastened to the base and which extends parallel to the X-direction, characterized in that the displaceable unit is displaceable relative to the base along the first guide parallel to a Y-direction by means of a Y-actuator, the first guide comprising a first surface which extends parallel to the X-direction and the Y-direction, which Y-actuator comprises a first part and a second part which are displaceable relative to one another and which exert a driving force on one another during operation, while the first part of the Y-actuator is coupled to the displaceable unit, seen parallel to the Y-direction, and the second part of the Y-actuator is coupled to said balancing unit, seen parallel to the Y-direction, the second guide comprising a second surface which extends parallel to the X-direction and to the Y-direction.

2. A positioning device as claimed in claim 1, characterized in that the balancing unit comprises a support body which comprises the first surface.

3. A positioning device as claimed in claim 1, characterized in that a center of gravity of the displaceable unit and a center of gravity of the balancing unit have identical positions, seen in a direction perpendicular to the X-direction and the Y-direction.

4. A positioning device as claimed in claim 3, if dependent on claim 2, characterized in that the support body comprises at least one raised wall which bounds the first surface.

5. A positioning device as claimed in claim 1, characterized in that the balancing unit is guided along the second guide by means of a static gas bearing.

6. A positioning device as claimed in claim 1, characterized in that the balancing unit comprises a first balancing part and a second balancing part, said first balancing part being coupled to the second part of the X-actuator and the second part of the Y-actuator, and said second balancing part being rotatable relative to the first balancing part about an axis of rotation which extends perpendicularly to the X-direction and the Y-direction by means of a rotation motor, which rotation motor comprises a first part and a second part which are rotatable relative to one another and which exert a driving torque on one another during operation, the first part of the rotation motor being fastened to the first balancing part and the second part of the rotation motor being fastened to the second balancing part.

7. A positioning device as claimed in claim 1, characterized in that the second part of the X-actuator is fastened to the balancing unit, the second part of the Y-actuator is fastened to the first part of the X-actuator, and the first part of the Y-actuator is coupled to the displaceable unit, as seen parallel to the X-direction and parallel to the Y-direction.

8. A positioning device as claimed in claim 7, characterized in that the positioning device is provided with a further X-actuator and a further Y-actuator, a first part of the further X-actuator and a first part of the further Y-actuator being fastened to the displaceable unit, while a second part of the further X-actuator and a second part of the further Y-actuator are fastened to the first part of the Y-actuator.

9. A positioning device as claimed in claim 1, characterized in that the second part of the X-actuator and the second part of the Y-actuator are fastened to the balancing unit.

10. A positioning device as claimed in claim 9, characterized in that the positioning device is provided with a further X-actuator and a further Y-actuator, a first part of the further X-actuator and a first part of the further Y-actuator being fastened to the displaceable unit, and a second part of the further X-actuator and a second part of the further Y-actuator being coupled to the first part of the X-actuator, seen parallel to the X-direction, and coupled to the first part of the Y-actuator, seen parallel to the Y-direction.

11. A lithographic device provided with a frame to which a radiation source, a mask holder, a focusing unit, and a positioning device are fastened, said focusing unit having a main axis, while the positioning device comprises a substrate holder which is displaceable relative to the focusing unit parallel to an X-direction which is perpendicular to the main axis and parallel to a Y-direction which is perpendicular to the X-direction and to the main axis, characterized in that the positioning device is a positioning device as claimed in claim 1, while the displaceable unit of the positioning device comprises the substrate holder, and the base of the positioning device is fastened to the frame.

12. A lithographic device as claimed in claim 11, characterized in that the mask holder is displaceable relative to the focusing unit parallel to the X-direction by means of a further positioning device.

13. A lithographic device as claimed in claim 12, characterized in that the further positioning device is provided with a further X-actuator having a first part and a second part which are displaceable relative to one another and which exert a driving force on one another during operation, said first part of the further X-actuator being coupled to the mask holder, seen parallel to the X-direction, and said second part of the further X-actuator being coupled to a further balancing unit, seen parallel to the X-direction, which further balancing unit is displaceable relative to the frame along a further guide which is fastened to the frame and which extends parallel to the X-direction.

* * * * *